(12) United States Patent
Obradovic et al.

(10) Patent No.: US 10,909,449 B2
(45) Date of Patent: Feb. 2, 2021

(54) MONOLITHIC MULTI-BIT WEIGHT CELL FOR NEUROMORPHIC COMPUTING

(71) Applicant: Samsung Electronics Co., Ltd., Suwon-si (KR)

(72) Inventors: Borna J. Obradovic, Leander, TX (US); Titash Rakshit, Austin, TX (US); Jorge A. Kittl, Austin, TX (US); Ryan Hatcher, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 842 days.

(21) Appl. No.: 15/678,050

(22) Filed: Aug. 15, 2017

(65) Prior Publication Data

US 2018/0300618 A1 Oct. 18, 2018

Related U.S. Application Data

(60) Provisional application No. 62/485,867, filed on Apr. 14, 2017.

(51) Int. Cl.

| | |
|---|---|
| *G06N 3/063* | (2006.01) |
| *G06N 3/04* | (2006.01) |
| *H01L 27/112* | (2006.01) |
| *H01L 27/11556* | (2017.01) |
| *G06N 3/08* | (2006.01) |
| *G11C 13/00* | (2006.01) |

(52) U.S. Cl.
CPC ............. *G06N 3/0635* (2013.01); *G06N 3/04* (2013.01); *G06N 3/049* (2013.01); *G06N 3/084* (2013.01); *H01L 27/11273* (2013.01); *H01L 27/11556* (2013.01); *G11C 13/0069* (2013.01)

(58) Field of Classification Search
None
See application file for complete search history.

(56) References Cited

U.S. PATENT DOCUMENTS

| | | | | |
|---|---|---|---|---|
| 3,104,358 A | * | 9/1963 | Heacock, Jr. | ........ G11C 27/026 327/318 |
| 5,247,606 A | | 9/1993 | Tam | |
| 8,250,011 B2 | | 8/2012 | van der Made | |
| 8,954,363 B2 | | 2/2015 | Heliot et al. | |
| 9,171,248 B2 | | 10/2015 | Heliot et al. | |
| 9,269,044 B2 | | 2/2016 | Akopyan et al. | |
| 10,528,643 B1 | * | 1/2020 | Choi | ........................ G06F 17/16 |
| 10,534,840 B1 | * | 1/2020 | Petti | ........................ G06N 3/04 |

(Continued)

FOREIGN PATENT DOCUMENTS

CN 105095967 A 11/2015

OTHER PUBLICATIONS

Chen, An et al.; A Survey on Architecture Advances Enabled by Emerging Beyond-CMOS Technologies; 2020; IEEE; pp. 46-68. (Year: 2020).*

(Continued)

*Primary Examiner* — Stanley K. Hill
(74) *Attorney, Agent, or Firm* — Lewis Roca Rothgerber Christie LLP

(57) ABSTRACT

A neuromorphic weight cell (NWC) including a resistor ladder including a plurality of resistors connected in series, and a plurality of shunting nonvolatile memory (NVM) elements, each of the shunting NVM elements being coupled in parallel to a corresponding one of the resistors.

20 Claims, 4 Drawing Sheets

(56) References Cited

U.S. PATENT DOCUMENTS

| | | |
|---|---|---|
| 2011/0004579 A1 | 1/2011 | Snider |
| 2015/0106316 A1 | 4/2015 | Birdwell et al. |
| 2016/0048755 A1 | 2/2016 | Freyman et al. |
| 2017/0011290 A1 | 1/2017 | Taha et al. |
| 2019/0065929 A1* | 2/2019 | Koelmans .............. G06N 3/088 |
| 2019/0244088 A1* | 8/2019 | Yang ....................... H01L 27/24 |
| 2019/0392881 A1* | 12/2019 | Rakshit ............... G11C 11/1673 |
| 2020/0034686 A1* | 1/2020 | Chiu ........................ G06N 3/04 |

OTHER PUBLICATIONS

Mayr, Christian et al.; A Biological-Realtime Neuromorphic System in 28 nm CMOS Using Low-Leakage Switched Capacitor Circuits; IEEE Transactions on Biomedical Circuits and Systems, vol. 10, No. 1, Feb. 2016; pp. 243-254. (Year: 2016).*

* cited by examiner

MONOLITHIC MULTI-BIT WEIGHT CELL FOR NEUROMORPHIC COMPUTING

CROSS-REFERENCE TO RELATED APPLICATION(S)

The present application claims priority to, and the benefit of, U.S. Provisional Patent Application No. 62/485,867, filed on Apr. 14, 2017, the contents of which are incorporated herein by reference in its entirety.

BACKGROUND

1. Field

Some embodiments of the present disclosure relate generally to deep-learning neural networks.

2. Description of the Related Art

Neural networks and deep learning provide improved solutions to problems arising in artificial image and speech recognition, as well as in natural language processing, and many other tasks that may be considered as classification tasks. Neural networks represent a paradigm shift from previous forms of computer programming.

In conventional computer programming, a computer is given explicit instructions regarding how to perform in response to a particular input by breaking down one or more big problems into smaller individual tasks that may be operated upon by the computer. Contrastingly, in a neural network, the programmed computer isn't explicitly directed as to how to solve the general problem. Instead, the computer is able to teach itself based upon observational data, thereby potentially determining a non-programmed solution to the general problem that is input to the computer.

Modern deep neural networks that are capable of deep learning exceed performance of conventional computing with respect to visual pattern recognition, speech recognition, and natural language processing. Accordingly, neural networks are increasingly deployed on a large scale to perform tasks previously only achievable by humans.

As an example, the human visual system, which has developed from hundreds of millions of years of evolution, enables recognition of a handwritten sequence of digits as being the numbers that the handwritten digits represent. This is made possible in part by the primary visual cortex of the human brain, which includes tens of millions of neurons, or synapses, which have tens of billions of connections between them. Accordingly, programming a computer to have similar capabilities in recognizing handwritten digits can be incredibly complex when the functions of the primary visual cortex are attempted to be represented algorithmically.

Artificial neural networks, or synaptic networks, can be fed a large number of training examples, each training example representing a differently represented handwritten digit. The neural network is able to learn from the training examples to generate rules, or to essentially program itself, for generally recognizing other handwritten digits not included as one of the training examples. Although a rate of accuracy of the neural network may depend on the number of iterations of the training examples, more accurately, the accuracy of a trained neural network depends on the size of a labelled dataset (training examples). That is, although a rate of accuracy also depends on the number of iterations used for training the network, a "sufficiently trained" network may reach a level of performance that is no longer improved by additional iterations.

FIG. 1 depicts an example of a hypothetical artificial neural network (ANN).

Referring to FIG. 1, an ANN generally consists of multiple layers of neurons/synapses. Although the present example depicts an ANN 100 having only three layers with only a few neurons 110 in each layer, typical ANNs may have thousands of layers with thousands of neurons per layer. The outputs of each of the neurons 110 of each layer are typically connected to all of the inputs of the neurons 110 of the next layer. The ANN 100 of the present example is relatively simple, and has only one hidden layer 130, which refers to a layer of the ANN 100 that is neither an input layer 120 or an output layer 140.

The input layer 120 of the ANN 100 is configured to receive a plurality of inputs, each neuron 110 of the input layer 120 receiving a respective input. The inputs represent, for example, a small portion of an image, or a small fragment of speech. For example, each input may represent a greyscale value of a corresponding pixel representing the small portion of an image to be recognized and categorized by the ANN 100. However, it should be noted that the inputs can alternatively represent a portion of anything else that is capable of being broken down into a plurality of small portions of the whole, each portion representing one of the inputs.

Based on the inputs, mathematical operations may be performed via one or more layers of the ANN 100. At the output layer 140 of the ANN 100, there may generally be a high activation for a single specific output 150, and a low activation for each of all of the other outputs 150. This is because an objective of the ANN 100 is to classify, for example, the input image into one of a plurality of classifications (e.g., a cat, a dog, an airplane, etc.), each classification being represented by a single one of the outputs 150. That is, the ANN 100 may classify the plurality of inputs entered into the input layer as collectively representing an image belonging to a single classification or category.

For a single neuron/synapse 110 of the ANN 100 (e.g., a neuron 110 in the hidden layer 130), the neuron 110 may have multiple inputs (e.g., multiple binary inputs) and a single output (e.g., a single binary output). Furthermore, a respective weight, or synaptic weight, may be assigned to each input depending on a level of importance, or value, of the input in determining the value of the output (e.g., a value of 0 or 1 for the output). That is, each connection between neurons 110 has a synaptic weight associated with it. The activation of each respective neuron 110 is computed by performing a weighted sum of the inputs to the neurons 110, and feeding that linear combination into a thresholding activation function.

Accordingly, if there is a sufficient number of high inputs (e.g., a binary input of 1) going through sufficiently high/ large weights, then the corresponding neuron 110 will be activated (neurons generally being either activated low or activated high, although there may be a smooth transition in between high and low). The varying activation levels of the neurons 110, therefore, ultimately determine how a plurality of inputs will be classified by the output layer 140, and the ANN 100 may be trained to improve accuracy of the classifications by adjusting or optimizing one or more of the weights.

Accordingly, a computational element of the ANN 100 performs a multiplication of a set of input signals by a set of weights followed by a summation. The weights are essentially a matrix that multiplies corresponding input vectors to produce an output vector, which then goes into non-linear thresholding. That is, the ANN 100 ultimately determines a value for each output of each neuron 110 based on a linear combination of input signals input to the neuron 110, which is then thresholded by a comparator.

SUMMARY

Some embodiments of the present disclosure provide an adjustable analog monolithic multi-bit weight cell made of a circuit comprising NVM elements and resistors, and methods of using the cell to implement neuromorphic/synaptronic computing.

According to some embodiments, there is provided a neuromorphic weight cell (NWC) including a resistor ladder including a plurality of resistors connected in series, and a plurality of shunting nonvolatile memory (NVM) elements, each of the shunting NVM elements being coupled in parallel to a corresponding one of the resistors.

A first resistor of the resistors at a top of the resistor ladder may have a lowest resistance value of the resistors, and resistance values of each subsequent one of the resistors may be twice a resistance value of an immediately preceding one of the resistors.

Each of the shunting NVM elements may have a first state of resistance and a second state of resistance, the first state of resistance being greater than the resistance value of the first resistor, and the second state of resistance being less than the resistance value of the first resistor.

Terminals of each of the shunting NVM elements may be individually addressable.

Each of the shunting NVM elements may include a two-terminal memristor, wherein the resistors include a vertical stack of doped poly layers.

According to some embodiments, there is provided an artificial neural network including a plurality of layers, each layer including a plurality of neural nodes, wherein an input of one of the neural nodes is configured to be adjustably weighted by a neuromorphic weight cell (NWC) implemented in hardware, the NWC including a resistor ladder including a plurality of resistors connected in series, and a plurality of shunting nonvolatile memory (NVM) elements, each of the shunting NVM elements being coupled in parallel to a corresponding one of the resistors, wherein the input of the one of the neural nodes is configured to be adjustably weighted by selectively operating one or more of the shunting NVM elements.

The shunting NVM elements may each include a flash transistor.

Gates of each of the shunting NVM elements may be connected to a common gate terminal.

The NWC may be configured to be read as a weight by floating all source and drain connections of the flash transistors, and applying a common voltage to the common gate terminal.

A cell weight of the NWC may be configured to be programmed by individually programming the flash transistors, wherein a programmed flash transistor of the flash transistors includes a source terminal set to ground and a drain terminal set to a high voltage, wherein all source and drain terminals of the flash transistors above the programmed flash transistor are set to ground, wherein all source and drain terminals of the flash transistors below the programmed flash transistor are set to the high voltage, and wherein gates of all of the flash transistors are set to the high voltage.

A cell weight of the NWC may be configured to be erased by grounding all source and drain terminals of all of the flash transistors, and setting the common gate terminal to a tunneling voltage, or by setting the common gate terminal to ground, and setting all of the source and drain terminals of all of the flash transistors to a tunneling voltage.

The flash transistors may be implemented as a vertical stack on a common poly-Si channel, and wherein the resistors are implemented as a separate vertical stack.

Resistance values of the resistors may be set by in-situ doping, and a doping concentrations of the resistors may vary as respective factors of two.

Sources and drains of the flash transistors may include heavily-doped Si layers, and may be coupled with respective contacts of the resistors, and a doping concentration of the heavily-doped Si layers may be at least an order of magnitude higher than a doping concentration of a most heavily doped one of the resistors.

The heavily-doped Si layers may be individually contacted by trench contacts.

A number of layers of the flash transistors may be greater than or equal to two.

The NWC may be configured to be read by floating all of the sources and drains of the flash transistors, and by applying a read voltage to an input terminal of the NWC.

According to some embodiments, there is provided a method of forming a neuromorphic weight cell (NWC) including a resistor ladder including a plurality of resistors connected in series, and a plurality of shunting nonvolatile memory (NVM) elements, each of the shunting NVM elements being coupled in parallel to a corresponding one of the resistors, the method including depositing a common polycrystalline Si channel on an insulating substrate, depositing a first spacer material layer on the common polycrystalline Si channel, depositing an insulating material as a sacrificial gate on the first spacer material layer, depositing a second spacer material layer on the insulating material, forming a plurality of flash transistors as a first vertical stack on the common polycrystalline Si channel, and forming a plurality of resistors as a second vertical stack on the common polycrystalline Si channel.

The method may further include selectively in-situ doping areas of the second vertical stack to set different resistance values of the resistors.

The method may further include performing etching and deposition to form trench contacts for individually contacting source and drain contacts of the flash transistors.

Accordingly, the described embodiments provide an analog monolithic multi-bit weight cell for neuromorphic/synaptronic computing.

BRIEF DESCRIPTION OF THE DRAWINGS

Some embodiments can be understood in more detail from the following description taken in conjunction with the accompanying drawings, in which.

DETAILED DESCRIPTION

Figure 1:
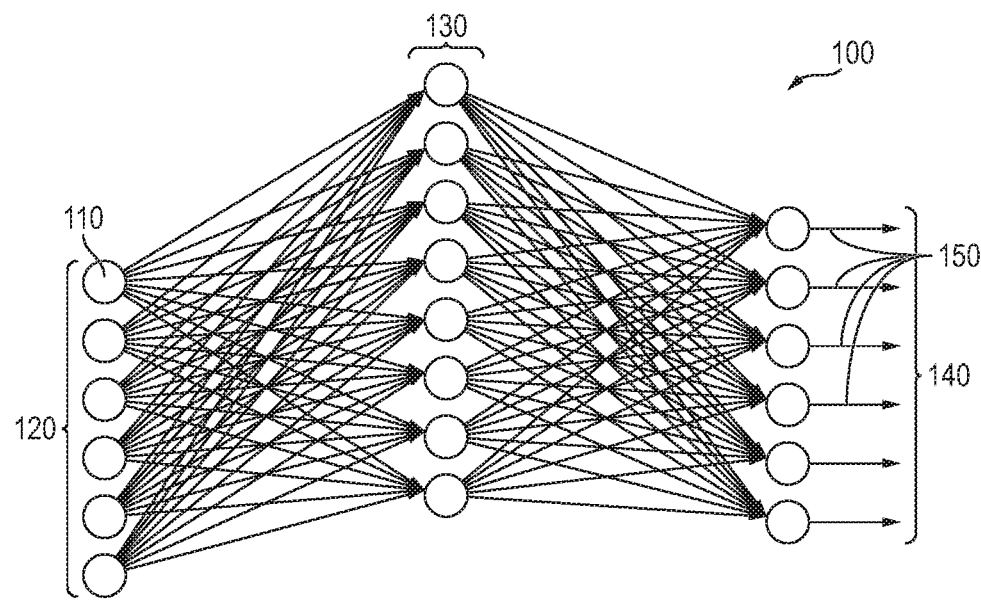
FIG. 1 depicts an example of a hypothetical artificial neural network (ANN)

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

As discussed above, an ANN may determine a value for each output of each neuron based on a linear combination of input signals input to the neuron, which is then thresholded by a comparator. Conventionally, a computation of a multiplication of a set of input signals by a set of weights followed by a summation was performed by the ANN in a vectorized (e.g., single instruction, multiple data (SIMD)) approach using specialized graphic processing units (GPUs). Vectorization by the ANN may be a linear transformation that converts a matrix into a column vector. While the vectorization performed by the ANN would greatly speed up the computation relative to a sequential CPU-style computation, such vectorization typically involves a large number of gates and significant energy consumption per computation cycle.

Alternatively, multiply-add computation may be implemented with a compact analog circuit. Non-volatile memory (NVM) elements whose conductivity is "memorized" may be used as the weights for application of multiply-add computation. However, the use of analog weights requires on-chip learning, because transferring exact analog weight values from off-chip training to the analog NVMs may be difficult or impossible due to IC process variability and analog programming randomness. Further, on-chip analog learning dramatically increases the complexity of the chip representing the ANN, and practical implementations might not always be possible.

Conventional hardware implementations of ANNs with analog multiply-add have generally used two options for weights—hardware elements, and multi-bit digital elements. Hardware elements have been used for pure analog weights, and use analog on-chip learning along with complex peripheral circuitry, thereby resulting in problems with weight saturation and noise. With respect to multi-bit digital implementations of weights, latches, flip-flops, and/or SRAM cells may be used for bit storage. Although such digital implementations have the benefit of simple programming, omitting the need for on-chip learning, and off-line learning that may be transferrable to array, such implementations may suffer from negative aspects of volatility, decreased power and performance, and relatively large area and large energy requirements (e.g., due to a digital-to-analog (D/A) converter for each bit).

Efficient performance may be achieved by local storage of weights (i.e. local to the neuron-neuron interconnection between neurons). Theoretically, each weight is a real number, and an activation level of each neuron is also a real number. Accordingly, an analog memory element may be used for storage of the weight, with conductance of the analog memory element representing the corresponding weight (e.g., the higher the conductance, the greater the influence of the input using that conductance).

Although such configurations provide a literal hardware description of a mathematical ANN having real weights, hardware design of such ANNs may have challenging problems. For example, analog weights may generally be difficult to program precisely partially due to the non-linear nature of the elements involved (e.g., flash, PCM, or memristors). Furthermore, the existence of process variations in NVM elements and/or programming circuitry indicates that the each element may be programmed in a feedback loop for sensing a level of programming (i.e., the "weight"). Accordingly, simply transferring trained/learned weights via off-chip programming will not necessarily result in accurate weights. Ultimately, a full backpropagation algorithm for ANN programming may be implemented on chip to achieve accuracy if analog weights are used, thereby resulting in a significant increase in circuit complexity, size, and energy requirements. Accordingly, it may be beneficial to enable the transfer of off-chip learned neural network (NN) weights to a hardware implementation of the NN, while retaining speed and energy advantages of the analog approach to multiply-and-add.

Embodiments of the present disclosure provide a multi-bit digital weight for an analog neuromorphic cell/neuron/synapse. Analog neurons provide a fast and energetically efficient way of performing a multiply-and-add operation for driving artificial neural networks (ANNs) to provide a wide range of classification tasks.

Embodiments of the present disclosure replace a fully analog weight with a multi-bid digital weight. Multi-bit digital representations of weights (unlike a corresponding analog approach) enables ANN training, or network learning, to be performed off-chip, and exact weights may be transferred accurately to the multi-bit digital network. By storing multiple bits (instead of a single bit, as conventionally done), a wider range of possible neural nets may be implemented, thereby enabling a relatively higher degree of complexity. However, because multi-bit weights may enable greater weight precision, and behavior of a hardware network may therefore be better matched to that of a software version of the network.

Accordingly, embodiments of the present disclosure may include a compact memory cell for multi-bit representation of an analog NN weight of a given node of an ANN. The cell is fundamentally analog (e.g., represented by a resistance value), and may be described with respect to an analog input voltage signal and an analog output current. However, the available range of weight values may be discrete and straightforwardly represented by a sequence of bits.

Figure 2:
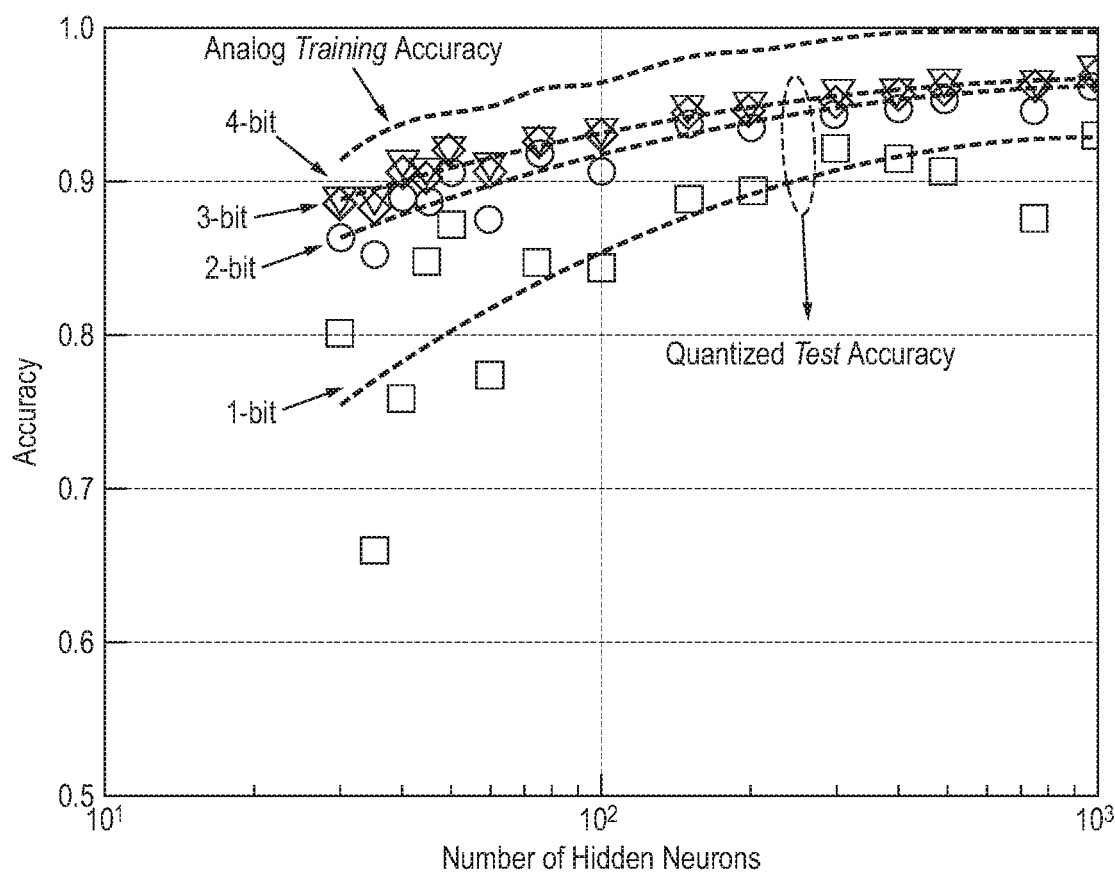
FIG. 2 depicts performance of an artificial neural network (ANN) used to identify handwritten numbers as a function of a number of hidden neurons of the ANN and of a number of bits used in the ANN.

FIG. 2 depicts performance of an artificial neural network (ANN) used to identify handwritten numbers as a function of a number of hidden neurons of the ANN and of a number of bits used in the ANN.

Referring to FIG. 2, a number of bits to be used in a given NN application can be determined while considering the existence of a strong tradeoff between weight precision and the number of neurons/synapses required to reach a given degree of accuracy. A current understanding of ANNs indicates that most classification tasks can be performed well with only three bits. Recently the Modified National Institute of Standards and Technology (MNIST) database, which may be seen as a benchmark for recognition of hand-written digits, has been successfully performed with only single-bit resolution.

Typically, to achieve classification accuracy of about 95%, an ANN having 1-bit resolution will generally use approximately 100 times more 1-bit neurons than an ANN having 3-bit resolution (using 3-bit neurons). That is, the higher the resolution, the fewer the total number of neurons needed in an ANN to achieve a set level of accuracy. Furthermore, accuracy for a general ANN may saturate at around three bits, such that there may be relatively little added benefit in having additional bits while using analog weights. However, it should be noted that other embodiments of the present disclosure may use a different number of bits. For example, the embodiments described below demonstrate that by using three bits, 8 levels of weight can be realized. However, for 4-bit resolution, 16 levels of weight can be realized, for 5-bit resolution, 32 levels of weight can be realized, etc.

Accordingly, relatively complex ANNs rarely use more than three bits of precision for the analog weight representation. Therefore, the weight cells for weighting the neural node inputs can be relatively compact. Because of bit-wise discretization, weights that are learned off-chip can be easily transferred to the NN hardware, with exact matching of software and in-silico representations. Because the weight cell supports fully analog input/output signals, the significant time and energy savings promised by fully analog NN representations can be realized without the requirement of on-chip learning. Accordingly, the embodiments described below enable weighting in an ANN to be achieved in hardware, as opposed to software.

Figure 3:
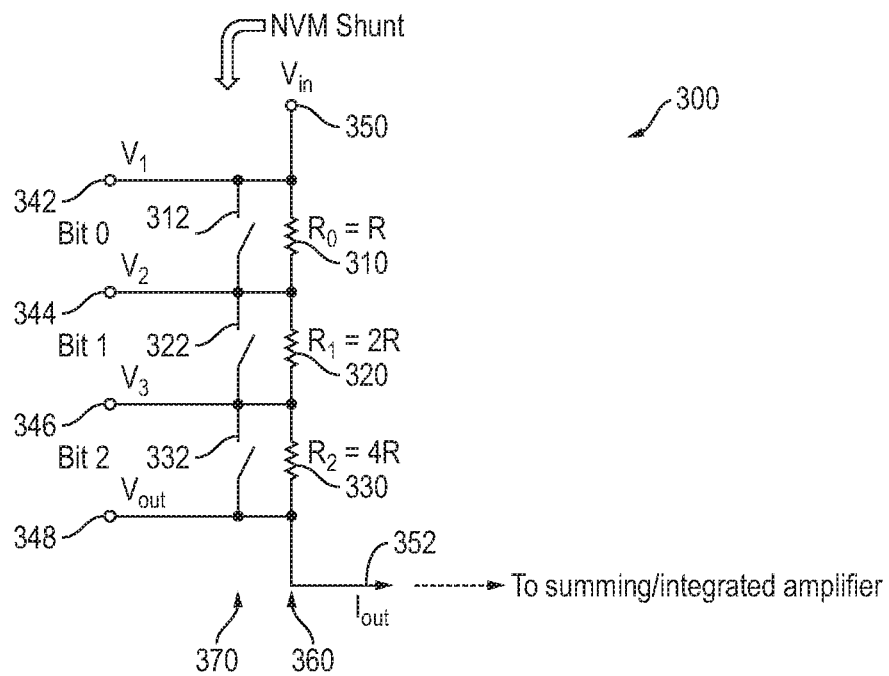
FIG. 3 depicts an analog neuromorphic weight cell of an artificial neural network (ANN) including nonvolatile memory (NVM) elements, according to an embodiment of the present disclosure.

FIG. 3 depicts an analog neuromorphic weight cell of an artificial neural network (ANN) including nonvolatile memory (NVM) elements, according to an embodiment of the present disclosure.

Referring to FIG. 3, according to the present embodiment, the multi-bit quantized resistance value described above may be achieved by a weight cell (e.g., a neuromorphic weight cell (NWC)) 300 including a resistor ladder 360 including a plurality of series-connected resistors 310, 320, 330 (one resistor for each bit in the quantization, or n resistors for n bits), and a plurality of NVM elements 312, 322, 332, each NVM element being configured to shunt a corresponding resistor of the resistor ladder 360. That is, two vertical stacks of devices may be formed for each weight cell 300—a fixed-value resistor stack 360, and the shunting NVM stack 370.

Accordingly, each resistor 310, 320, 330 may be effectively either activated or deactivated by operation of a corresponding NVM element as a shunt device, thereby providing an adjustable individual neuromorphic weight cell 300 of an ANN. That is, each resistor may be shunted by an NVM element having a wide range of resistance states available, such that in the "ON" state of the NVM, the resistor in parallel with the NVM element is completely shunted (e.g., a resistance value of the parallel combination of the NVM element and the resistor is much smaller than a resistance value of any of the resistors 310, 320, 330). Likewise, in the "OFF" state of the NVM element, the resistance of the NVM element must be much larger than R, so that the NVM element is basically an "open," and therefore conducts negligible current.

In the present embodiment, a three-bit neural network may suffice to achieve a desired level of classification accuracy, as ANNs may operate well with 3-bit quantization (with even fewer bits sufficing for some ANNs) and a full analog operation not necessary. Due to the structure of the resistor ladder 360, a weight cell 300 may be represented by a multi-bit quantized resistance value, as shown in the following equation:

Due to the series combination of the resistors 310, 320, 330 in the resistor ladder 360, with respective resistance values R0, R1, R2 of the resistors 310, 320, 330 increasing as powers of 2 for each subsequent resistor (e.g., a resistance value of the first resistor 310 representing the most significant bit, or "Bit 0," may be 1R, while a resistance value of the second resistor 320 may be 2R, and the resistance value of the third resistor 330, which represents the least significant bit in the present embodiment using 3-bit quantization, may be 4R). That is, the resistor values R0, R1, R2 of the resistors 310, 320, 330 form a binary geometric sequence (e.g., R, 2R, 4R, etc., where R is the base resistance value for the resistor ladder 360).

Because each NVM (non-volatile memory) switch may, theoretically, either completely shunt a corresponding resistor, or may be completely open (such that all current flows through the corresponding resistor), the series combination of the resistors provides an n-bit quantization of the resistance value $(2^n-1)R$. That is, in the present example, resistance values of 0R, 1R, 2R, 3R, 4R, 5R, 6R, and 7R may be achieved by varied operation of the three independent NVM elements 312, 322, 332 operating as switches (e.g., by changing voltage values Vin, V1, V2, V3, and Vout corresponding to inputs 350, 342, 344, 346, and 348).

In other embodiments, the NVM elements may have contact source and drain (SD) regions, as well as gates (e.g., the NVM elements may be three-terminal NVM elements). Using the various contacts of the NVM elements 312, 322, 332, the NVM elements 312, 322, 332 can be individually programmed into ON or OFF states, thereby enabling an n-bit quantization of the resistance values from approximately 0 to $(2n-1)R$ (when using n resistors and n NVM elements, n being a natural number). The NVM elements 312, 322, 332 need not be programmed to a high degree of accuracy. Instead, the NVM elements 312, 322, 332 may operate sufficiently if operated to be either strongly "ON" or strongly "OFF," where strong is measured on a scale of a resistance value R of a first resistor 310 having a lowest resistance of the resistors 310, 320, 330. However, the exact values are of little consequence, thereby greatly simplifying programming.

Accordingly, multiple flash devices/NVM elements 312, 322, 332 and resistors 310, 320, 330 may be used to represent a single neuromorphic/synaptic weight cell 300. The weight of each weight cell 300 corresponds to the conductance of the resistor ladder 360 connected between a voltage line/weight cell input 350 and a neuron line/weight cell output 352. The NVM elements 312, 322, 332 may be programmed in a digital mode (e.g., either strongly programmed or strongly erased).

The matrix corresponding to the weights of the weight cell 300 is a set of conductances of the structure of the resistor ladder 360, and the vector that is fed into the weight cell 300 is a set of voltages that are input to the input 350 of the weight cell 300. Further, a set of currents produced at the output 352 of the weight cell 300 are the product of the conductance matrix multiplied by the voltage vector. Accordingly, approximate matrix vector products may be achieved with the depicted structure by changing inputs of the weight cell 300 to values of voltages and outputs of the weight cell 300 to values of currents.

The present embodiment treats the resistive ladder 360 as a circuit of standard CMOS elements (resistors 310, 320, 330) and standard NVM elements 312, 322, 332, which may be implemented in an existing CMOS process. A circuit layout of the present embodiment uses an amount of space that is proportional to a number of bits for the weight representation. The resistor stack 360 may be formed by selective in-situ doping of a vertical polysilicon pillar. If the spacing between layers is not constant, resistor doping concentration may be chosen so that the total resistance of the resistor sequence is still 1R, 2R, 4R, etc. Suitable doping values may range from $1e18/cm^3$ to $1e19/cm^3$.

Unlike conventional approaches, the embodiments of the present disclosure are fundamentally different from standard D/A conversion, in that electrical inputs and outputs of the weight cell 300 are analog, while only weight representation is multi-bit digital. Although NVM elements 312, 322, 332 are described with respect to the present embodiment, as will be discussed below, various options are available for the shunt switches for shunting resistors of resistor ladders of weight cells of other embodiments.

Figure 4:
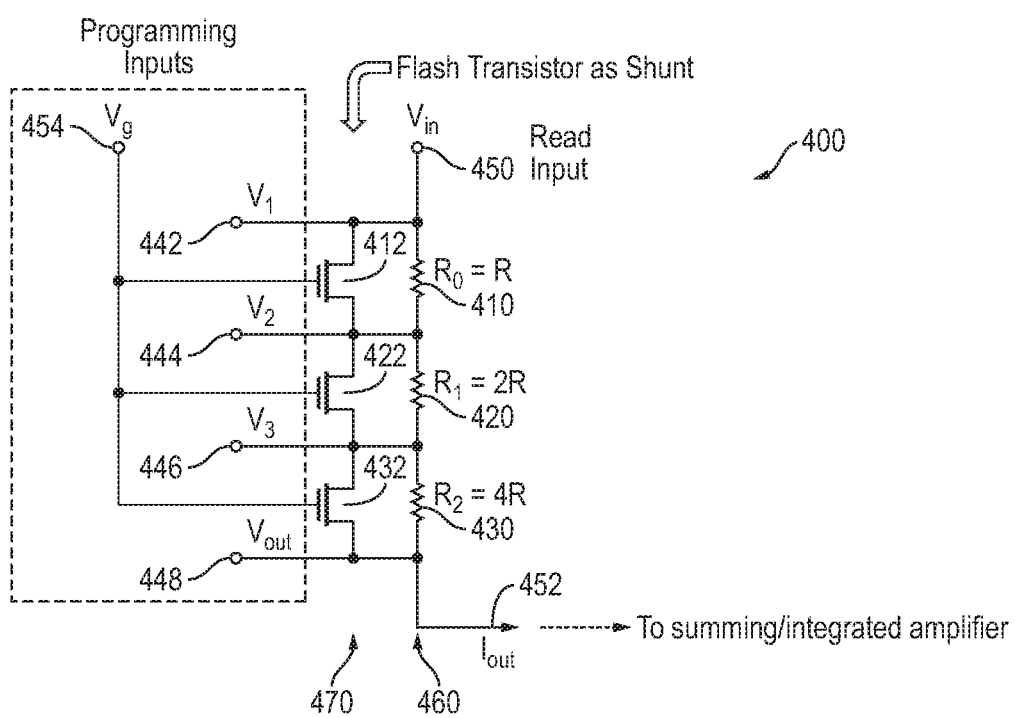
FIG. 4 depicts an analog neuromorphic weight cell of an artificial neural network (ANN) including flash transistors, according to an embodiment of the present disclosure.

FIG. 4 depicts an analog neuromorphic weight cell of an artificial neural network (ANN) including flash transistors, according to an embodiment of the present disclosure.

Referring to FIG. 4, a NOR flash element (e.g., a flash transistor) may be used as an NVM shunt element. Accordingly, the weight cell 400 of the present embodiment uses a flash transistor stack 470 including a plurality of flash transistors 412, 422, 432 instead of the shunting NVM stack 370 used in the weight cell 300 of the previous embodiment.

The weight cell 400 of the present embodiment provides a large dynamic range of shunt resistance values having multiple orders of magnitude. Accordingly, a maximum resistance of a shunt (e.g., one of the flash transistors 412, 422, 432) may be much greater than the resistance value R0 of the first resistor 410 (much less than the resistance value of R), thereby achieving an excellent open. Furthermore, a minimum resistance that may be achieved by the shunt may be less than or approximately equal to a resistance value R0 of the first resistor 410, which may introduce some variability in series resistance if the resistance value R0 of the first resistor 410 is not made to be sufficiently large.

Furthermore, a product of the resistance value R0 of the first resistor 410 and a capacitance value at an input of a summing amplifier coupled to the output 452 of the weight cell 400 may be less than a clock period of a system implementing the weight cell 400.

In the present embodiment, each of the flash transistors 412, 422, 432 may receive a same gate voltage Vg at a common gate terminal 454, but may be individually controlled by varying corresponding input and output voltages of each of the flash transistors 412, 422, 432.

For example, a first flash transistor 412 in parallel with the first resistor 410 may have a source terminal 442 having a voltage value of V1, and a drain terminal 444 having a voltage value of V2. A second flash transistor 422, which is in parallel with the second resistor 420, may have an source terminal 444 that has a voltage value equal to that of the drain terminal 444 of the first transistor 412 (e.g., V2), and may have a voltage value V3 at a drain terminal 446 that is equal to the voltage value V3 of a source terminal of a third transistor 432. The third transistor 432, which is in parallel with the third resistor 430, may have a drain terminal 448 having a voltage value of Vout.

Accordingly, a current value Iout, which is output from an output 452 of the weight cell 400 to a summing/integration amplifier, and which corresponds to a voltage value Vin at the input 450 of the weight cell 400, may be manipulated by varying the gate voltage value Vg and the input/output voltage values V1, V2, V3, and Vout corresponding to the different flash transistors 412, 422, 432. That is, the output of the weight cell 400 (i.e., output current value Iout), which is based on the input voltage value Vin of the input 450 of the weight cell 400, can be variously weighted by individual operation of the flash transistors 412, 422, 432. Accordingly, the weight cell 400 may be programmed as follows.

Using a second bit "Bit 1" corresponding to a second resistor 420 and a second flash transistor 422 as an example, high resistance (e.g., using HCl) may be achieved by setting the gate voltage value Vg, the voltage value V3 of the drain terminal 446 of the second flash transistor 422, and the voltage value VOUT of the drain terminal 448 of the third flash transistor 432 to a high voltage (e.g., VHIGH), and by setting the voltage values V1 and V2 of the source terminals 442 and 444 of the first and second flash transistors 412, 422 to a low voltage (e.g., GND).

Low resistance (using tunneling, all bits) may be achieved by setting the gate voltage Vg to a tunnel voltage value "−VTUNNEL," and by setting the voltage values V1, V2, V3, and VOUT to GND, thereby shunting the resistor ladder 460, such that electrons move from the floating poly to the channel by tunneling through the gate oxide. The input voltage value Vin of the input 450 of the weight cell 400 may be set to a voltage value of VLIN.

The weight cell 400 may be read by setting the gate voltage value Vg to VHIGH, by setting the voltage values V1, V2, V3, and VOUT to have a high impedance, and by setting the voltage value Vin of the input 450 of the cell 400 to VLIN or some other voltage value that is sufficiently high for performance, but is significantly less than the VHIGH. Furthermore, by applying a common voltage to the common gate terminal, the flash transistors operate in a linear mode irrespective of a value of a signal voltage applied to the NWC. Furthermore, no tunneling may occurs through a corresponding gate oxide, and no hot-carrier injection (HCI) may occur into a floating poly, thereby avoiding a read disturb.

In forming the flash transistors 412, 422, 432, a number of layers of the flash transistors 412, 422, 432 may be greater than or equal to two, but may be as high as the process capability permits (e.g., at least three layers for best performance).

Figure 5:
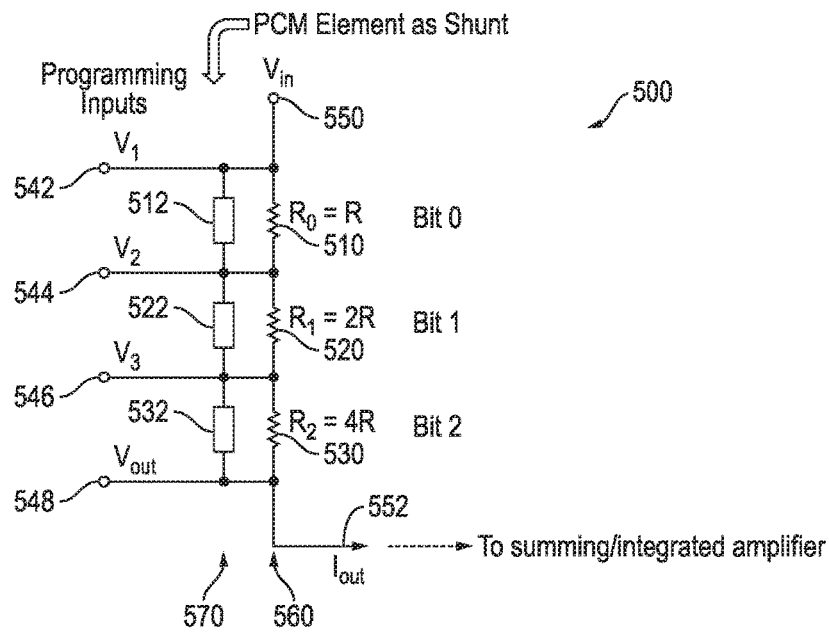
FIG. 5 depicts an analog neuromorphic weight cell of an artificial neural network (ANN) including two-terminal NVM elements, according to an embodiment of the present disclosure.

FIG. 5 depicts an analog neuromorphic weight cell of an artificial neural network (ANN) including two-terminal NVM elements, according to an embodiment of the present disclosure.

Referring to FIG. 5, according to the present embodiment, in a weight cell 500, a memristor element (e.g., memristor elements 512, 522, 532) may be used as the NVM shunt element instead of the NVM elements 312, 322, 332 and the flash transistors 412, 422, 432 of the weight cells 300 and 400 of the previously described embodiments. Accordingly, a memristor element stack 570 may be used in parallel to the resistor stack 560.

A type of the memristor elements 512, 522, 532 that are used may be one of several types, including PCM (as in the present embodiment), CBRAM, or any other two-terminal non-volatile resistor. The present embodiment provides a limited but acceptable dynamic range (e.g., two orders of magnitude). Like the shunt elements of the previous embodiments, an NVM element is provided for, and in parallel to, each of the resistors 510, 520, 530 of the resistor stack 560. Accordingly, by individually operating the different memristor elements 512, 522, 532, a range of weights/resistances may be implemented in an analog circuit.

Programming of the weight cell 500 of the present embodiment may be achieved as follows.

A subject NVM element may be programmed by setting a source voltage of the NVM element to GND, and setting a drain voltage of the NVM element to VHIGH_P, where the value of VHIGH_P depends on the type of memristor elements 512, 522, 532 used, and may be in the range of 1.5V-2.5V. All input terminals on the memristors above the memristor being programmed may be set to GND, while all input terminals on the memristors below the memristor being programmed may be set to VHIGH_P.

For example, in programming the second bit "Bit 1," to achieve high resistance, first and second voltage values V1 and V2 of inputs 542 and 544 may be set to GND, and a third input voltage value V3 and the output voltage value Vout of inputs 546 and 548 may be set to a relatively extremely high voltage (e.g., V_XHIGH, where V_XHIGH is much greater than V_HIGH).

Similarly, the weight cell 500 may be erased by resetting individual memristor elements 512, 522, 532 of the cell 500. The resetting of the cell 500 may be accomplished by a method similar to the one used to program the cell 500, but instead a voltage level of VHIGH_E instead of VHIGH_P may be used (where VHIGH_E is greater than VHIGH_P, although specific values of the voltage level may depend on the type of memristor chosen). For example, values of VHIGH_P may be as low as 1.5V, or as high as 10V.

Accordingly, and still using the second bit "Bit 1" as an example, to achieve a low resistance, the first and second voltage values V1 and V2 may be set to GND, and the third voltage value V3 and the output voltage value VOUT may be set to a high voltage (e.g., V_HIGH).

To read the weight cell 500, voltage values V1, V2, V3, and VOUT may be set to a high impedance, the voltage value Vin of the input 550 of the cell 500 may be set to VLIN (e.g., sufficiently high for performance, but much less than VHIGH). However, a suitable read voltage level applied as the input voltage Vin to the input 550 of the weight cell 500 may depend on the specific type of read element used, and should be lower than the programming voltage of said element. An example suitable voltage might be 0.7V, but also as high as 1.5V.

Figure 6:
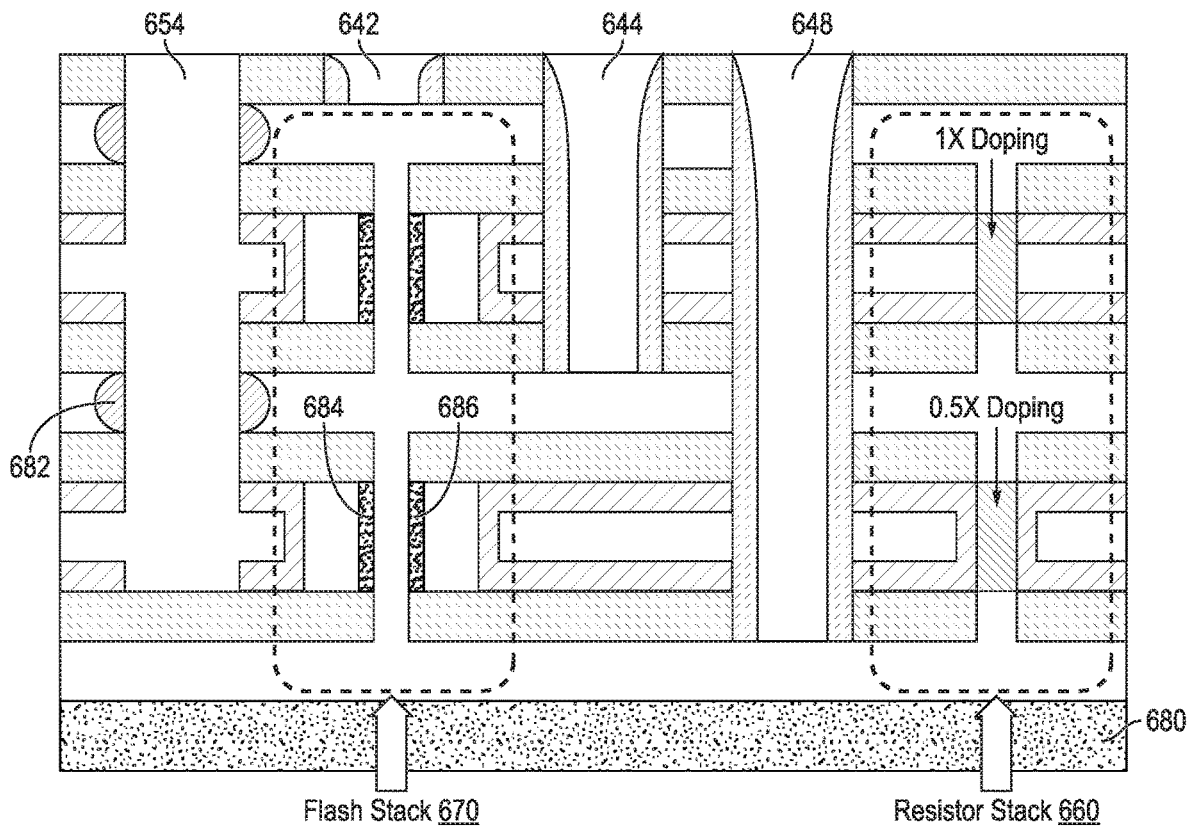
FIG. 6 depicts a 2-dimensional representation of layers of a neuromorphic weight cell, according to an embodiment of the present disclosure.

FIG. 6 depicts a 2-dimensional representation of layers of a neuromorphic weight cell, according to an embodiment of the present disclosure.

Referring to FIG. 6, unlike the previous embodiments discussed with respect to FIGS. 3-5, the present embodiment depicts a weight cell 600 having 2-bit resolution (as opposed to 3-bit resolution).

The weight cell 600 may be formed by providing a substrate 680, and then depositing a silicon layer on the substrate 680. Thereafter, a spacer layer (e.g., SiO2) may be formed on the silicon layer. On top of the spacer layer, the gate dielectrics 684 (e.g., IL+Hi−K, SiO2) and the floating gate 686 (e.g., poly Si) may be formed in a flash element the flash stack 670 on respective sides of the polysilicon vertical channel. Furthermore, doping may be performed on top of the spacer layer in the resistor stack 660 to set a resistance value of a resistor. Thereafter, an additional spacer layer may be deposited.

Another silicon layer may then be deposited on top of the additional spacer layer, and internal spacers 682 of the common gate 654 may be formed in the silicon layer. Then, another spacer layer may be deposited, and an additional layer including another flash element in the flash stack 670 may be formed along with an additional resistor in the resistor stack 660. The additional resistor may be doped twice as heavily as the initial resistor to thereby have a resistance value that is approximately twice that of the initial resistor. Thereafter, another spacer layer, followed by a silicon layer, and yet another spacer layer may be deposited.

After the layers are deposited, the various layers may be selectively etched and filled to form the common gate 654 and the various inputs 642, 644, 648 of the two flash elements in the flash stack 670.

Figure 7:
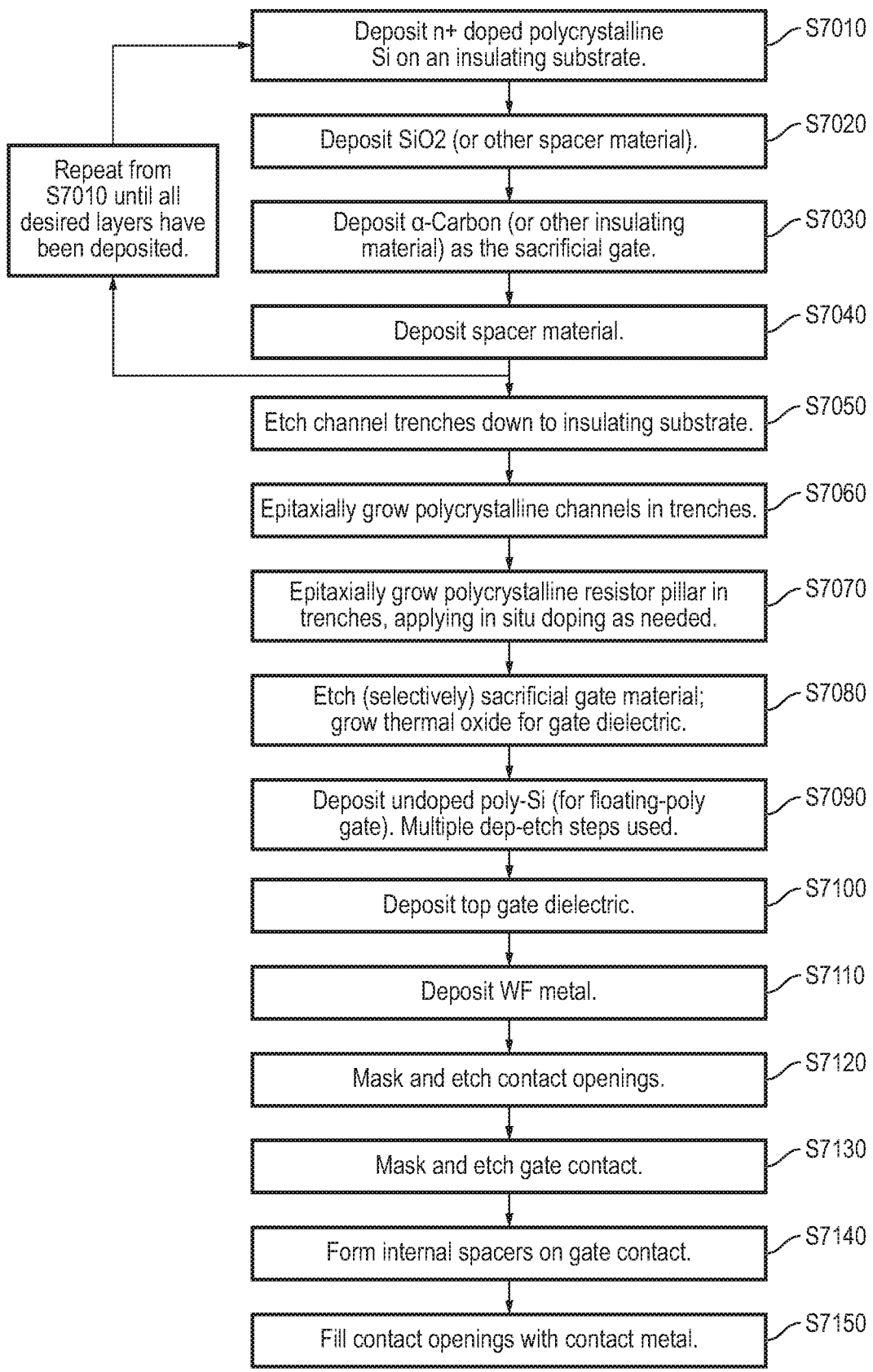
FIG. 7 depicts a notional process flow for the flash and resistor stack of the neuromorphic weight cell shown in FIG. 6, according to an embodiment of the present disclosure.

FIG. 7 depicts a notional process flow for the flash and resistor stack of the neuromorphic weight cell shown in FIG. 6, according to an embodiment of the present disclosure.

Referring to FIG. 7, first, an n+ doped polycrystalline Si may be deposited on an insulating substrate (S7010). Then, SiO2, or some other spacer material, may be deposited (S7020). Then, alpha-Carbon, or some other insulating material, may be deposited as a sacrificial gate (S7030). Then, a spacer material may be deposited (S7040). Operations S7010 to S7040 may then be repeated until all desired layers have been deposited (e.g., depending on the number of bits implemented in the subject weight cell).

Thereafter, channel trenches may be etched down to insulating substrate (S7050). Then, polycrystalline channels may be epitaxially grown in the trenches (S7060), and polycrystalline resistor pillars may be epitaxially grown in the trenches, with in situ doping being applied as suitable (S7070).

Thereafter, a sacrificial gate material may be selectively etched, and a thermal oxide may be grown for a gate dielectric (S7080). Then, undoped poly-Si (for floating-poly gate) may be deposited, and multiple deposition-etch steps may be used (S7090).

Then, a top gate dielectric may be deposited (S7100), and a workfunction (?) WF metal may be deposited (7110). Then, a mask and may be used to etch contact openings (S7120), and another mask may be used to etch a gate contact (S7130). Then, internal spacers may be formed on the gate contact (S7140), and the contact openings may be filled with contact metal (S7150).

Accordingly, embodiments of the present disclosure provide an adjustable analog monolithic multi-bit weight cell made of a circuit comprising NVM elements and resistors for neuromorphic/synaptronic computing.

What is claimed is:

1. A neuromorphic weight cell (NWC) comprising:
a resistor ladder comprising a plurality of resistors connected in series; and
a plurality of shunting nonvolatile memory (NVM) elements, each of the shunting NVM elements being coupled in parallel to a corresponding one of the resistors.

2. The NWC of claim 1, wherein a first resistor of the resistors at a top of the resistor ladder has a lowest resistance value of the resistors, and
wherein resistance values of each subsequent one of the resistors is twice a resistance value of an immediately preceding one of the resistors.

3. The NWC of claim 2, wherein each of the shunting NVM elements has a first state of resistance and a second state of resistance, the first state of resistance being greater than the resistance value of the first resistor, and the second state of resistance being less than the resistance value of the first resistor.

4. The NWC of claim 1, wherein terminals of each of the shunting NVM elements are individually addressable.

5. The NWC of claim 1, wherein each of the shunting NVM elements comprise a two-terminal memristor, wherein the resistors comprise a vertical stack of doped poly layers.

6. An artificial neural network comprising a plurality of layers, each layer comprising a plurality of neural nodes, wherein an input of one of the neural nodes is configured to be adjustably weighted by a neuromorphic weight cell (NWC) implemented in hardware, the NWC comprising:
a resistor ladder comprising a plurality of resistors connected in series; and
a plurality of shunting nonvolatile memory (NVM) elements, each of the shunting NVM elements being coupled in parallel to a corresponding one of the resistors,
wherein the input of the one of the neural nodes is configured to be adjustably weighted by selectively operating one or more of the shunting NVM elements.

7. The artificial neural network of claim 6, wherein the shunting NVM elements each comprise a flash transistor.

8. The artificial neural network of claim 7, wherein gates of each of the shunting NVM elements are connected to a common gate terminal.

9. The artificial neural network of claim 8, wherein the NWC is configured to be read as a weight by:
floating all source and drain connections of the flash transistors; and
applying a common voltage to the common gate terminal.

10. The NWC of claim 9, wherein a cell weight of the NWC is configured to be programmed by individually programming the flash transistors,
wherein a programmed flash transistor of the flash transistors comprises a source terminal set to ground and a drain terminal set to a high voltage,
wherein all source and drain terminals of the flash transistors above the programmed flash transistor are set to ground,
wherein all source and drain terminals of the flash transistors below the programmed flash transistor are set to the high voltage, and
wherein gates of all of the flash transistors are set to the high voltage.

11. The NWC of claim 8, wherein a cell weight of the NWC is configured to be erased by grounding all source and drain terminals of all of the flash transistors, and setting the common gate terminal to a tunneling voltage, or by setting the common gate terminal to ground, and setting all of the source and drain terminals of all of the flash transistors to a tunneling voltage.

12. The NWC of claim 8, wherein the flash transistors are implemented as a vertical stack on a common poly-Si channel, and wherein the resistors are implemented as a separate vertical stack.

13. The NWC of claim 12, wherein resistance values of the resistors are set by in-situ doping, and wherein a doping concentrations of the resistors vary as respective factors of two.

14. The NWC of claim 13, wherein sources and drains of the flash transistors comprise heavily-doped Si layers, and are coupled with respective contacts of the resistors, and
wherein a doping concentration of the heavily-doped Si layers is at least an order of magnitude higher than a doping concentration of a most heavily doped one of the resistors.

15. The NWC of claim 14, wherein the heavily-doped Si layers are individually contacted by trench contacts.

16. The NWC of claim 15, wherein a number of layers of the flash transistors is greater than or equal to two.

17. The NWC of claim 16, wherein the NWC is configured to be read by floating all of the sources and drains of the flash transistors, and by applying a read voltage to an input terminal of the NWC.

18. A method of forming a neuromorphic weight cell (NWC) comprising a resistor ladder comprising a plurality of resistors connected in series, and a plurality of shunting nonvolatile memory (NVM) elements, each of the shunting NVM elements being coupled in parallel to a corresponding one of the resistors, the method comprising:
- depositing a common polycrystalline Si channel on an insulating substrate;
- depositing a first spacer material layer on the common polycrystalline Si channel;
- depositing an insulating material as a sacrificial gate on the first spacer material layer;
- depositing a second spacer material layer on the insulating material;
- forming a plurality of flash transistors as a first vertical stack on the common polycrystalline Si channel; and
- forming a plurality of resistors as a second vertical stack on the common polycrystalline Si channel.

19. The method of claim 18, further comprising selectively in-situ doping areas of the second vertical stack to set different resistance values of the resistors.

20. The method of claim 18, further comprising performing etching and deposition to form trench contacts for individually contacting source and drain contacts of the flash transistors.

* * * * *